(12) United States Patent
Lin et al.

(10) Patent No.: US 6,909,628 B2
(45) Date of Patent: Jun. 21, 2005

(54) HIGH DENSITY MAGNETIC RAM AND ARRAY ARCHITECTURE USING A ONE TRANSISTOR, ONE DIODE, AND ONE MTJ CELL

(75) Inventors: Wen-Chin Lin, Hsin-Chu (TW); Denny D. Tang, Saratoga, CA (US); Yu Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 240 days.

(21) Appl. No.: 10/366,498

(22) Filed: Feb. 13, 2003

(65) Prior Publication Data

US 2004/0160251 A1 Aug. 19, 2004

(51) Int. Cl.[7] .............................................. G11C 11/00
(52) U.S. Cl. ........................ 365/158; 365/171; 365/173
(58) Field of Search ................................. 365/158, 171, 365/173

(56) References Cited

U.S. PATENT DOCUMENTS

| | | | |
|---|---|---|---|
| 5,793,697 A | * 8/1998 | Scheuerlein | 365/171 |
| 6,072,718 A | * 6/2000 | Abraham et al. | 365/158 |
| 6,272,041 B1 | 8/2001 | Naji | 365/171 |
| 6,335,890 B1 | 1/2002 | Reohr et al. | 365/225.5 |
| 6,418,046 B1 | 7/2002 | Naji | 365/158 |
| 6,421,270 B1 | 7/2002 | Tai | 365/158 |

OTHER PUBLICATIONS

Tehrani et al., "Progress and Outlook for MRAM Technology", IEEE Transactions on Magnetics, vol. 35, No. 5, Sep. 1999, pp. 2814–2819.

* cited by examiner

Primary Examiner—Huan Hoang
(74) Attorney, Agent, or Firm—Haynes and Boone, LLP (57) ABSTRACT

A new magnetic RAM cell device is achieved. The device comprises a MTJ cell comprising a free layer and a pinned layer separated by a dielectric layer. A diode is coupled between the free layer and a reading line. A writing switch is coupled between a first end of the pinned layer and a first writing line. A second end of the pinned layer is coupled to a second writing line. Architectures using MRAM cells are disclosed.

39 Claims, 7 Drawing Sheets

HIGH DENSITY MAGNETIC RAM AND ARRAY ARCHITECTURE USING A ONE TRANSISTOR, ONE DIODE, AND ONE MTJ CELL

CROSS-REFERENCE

This invention relates to U.S. Pat. Ser. No. 10/353,583, filed Jan. 29, 2003, now issued Pat. No. 6,711,053 entitled, "Scaleable High Performance Magnetic Random Access Memory Cell and Array" assigned to a common assignee.

BACKGROUND OF THE INVENTION (1) Field of the Invention

The invention relates to a magnetic RAM device and, more particularly, to a magnetic RAM device based on a magnetic tunnel junction cell.

(2) Description of the Prior Art

Magnetic memory devices, based on magnetic tunnel junction (MTJ) cells, are an important new type of memory technology. Magnetic RAM arrays can be formed on an integrated circuit to provide non-volatility, high speed, low writing energy, infinite write cycles, and immunity to radiation. These advantages make magnetic RAM a technology with great promise.

Figure 1:
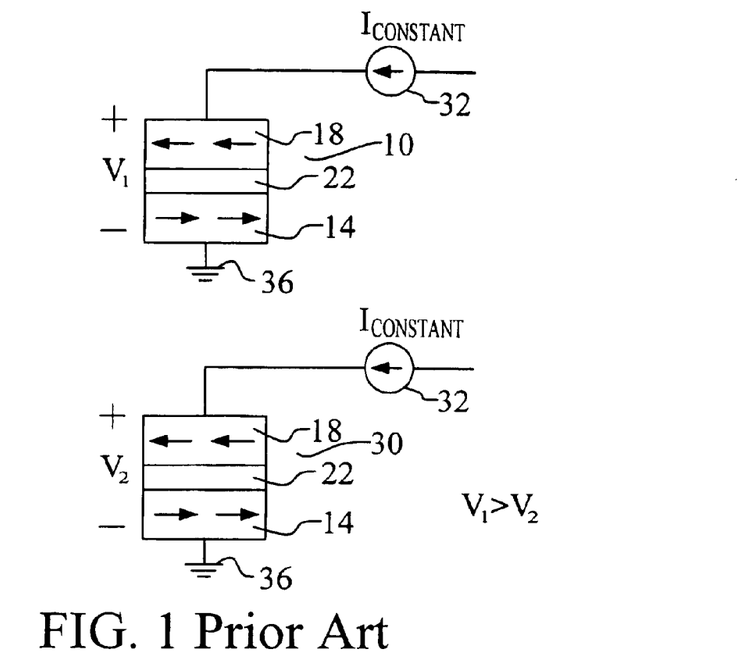
FIG. 1 illustrates reading a magnetic tunnel junction device.

Referring now to FIG. 1, models of magnetic tunnel junction cells 10 and 30 are illustrated. A magnetic tunnel junction cell 10 and 30 comprises a pinned layer 14, a free layer 18, and a dielectric layer 22. Typically, the free layer 18 and the pinned layer 14 comprise ferromagnetic materials that can be magnetically oriented. The free layer 18 is configured such that the magnetic orientation can be changed, or rotated, by exposure to an external magnetic field. The pinned layer 14 is configured such that the magnetic orientation is fixed and will not respond to a typical magnetic field. The dielectric layer 22 typically comprises a relatively thin oxide layer capable of electrically isolating the free layer 18 from the pinned layer 14 at low potentials and capable of conducting current through electron tunneling at higher potentials. The dielectric layer 22 may be called a tunnel layer.

In the first MTJ cell 10, the pinned layer 14 and the free layer 18 are magnetically oriented in opposite directions. In the second MTJ cell 30, the pinned layer 14 and the free layer 18 are magnetically oriented in the same direction. If the same current value $I_{CONSTANT}$ 32 is forced through each cell 10 and 30, it is found that the first cell 10 voltage $V_1$ is larger than the second cell 30 voltage $V_2$. In general, the resistance of an opposite-oriented MTJ cell 10 is greater than the resistance of a same-oriented MTJ cell 30. Binary logic data ('0' and '1') can be stored in a MTJ cell and retrieved based on the cell orientation and resulting resistance. Further, since the stored data does not require a storage energy source, the cell is non-volatile.

Figure 2:
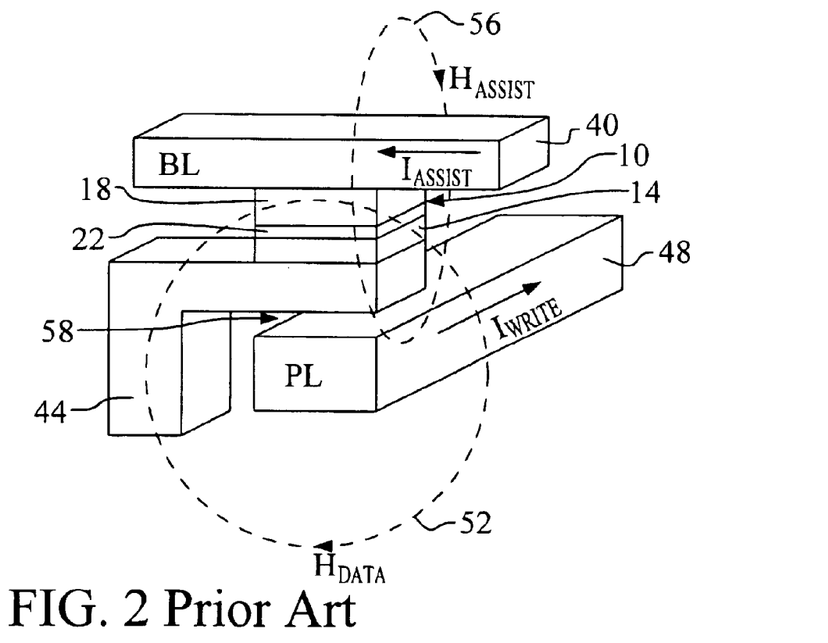
FIG. 2 illustrates writing a magnetic tunnel junction device.

Referring now to FIG. 2, the program scheme of a prior art MTJ cell 10 is illustrated. The MTJ cell 10 is electrically coupled to a bit line (BL) 40 overlying the free layer 18. A program line (PL) 48 runs under the MTJ cell 10. However, the PL 48 is electrically isolated from the MTJ cell 10 by a dielectric material such that a large gap 58 exists. To program the cell, PL 48 conducts a writing current $I_{WRITE}$ to generate magnetic field $H_{DATA}$ 52. The direction of $H_{DATA}$ 52 depends on the direction of $I_{WRITE}$. In addition, an assist current $I_{ASSIST}$ is conducted by the BL 40. $I_{ASSIST}$ generates a magnetic field $H_{ASSIST}$ 56 that is orthogonal to the longitudinal axis of the cell 10. The $H_{ASSIST}$ 56 field assists the $H_{DATA}$ 52 field in switching the magnetic orientation of the free layer 18 but will not program the cell without the $H_{DATA}$ 52 field generated by the program line 48. Therefore, the cell 10 at the intersection of an active program line 48 and an active bit line 40 is programmed.

There are two significant problems with this design. First, the magnetic coupling between the PL 48 and the cell 10 is not optimal due to the gap 58. Therefore, a large writing current $I_{WRITE}$ must be used to generated adequate field strength. This large writing current can approach the electromigration limit of the conductor and prevents downward scaling of the RAM cell 10. Second, there can be many other non-selected cells that are exposed to magnetic fields generated by the active program line 48 and bit line 52.

Figure 3:
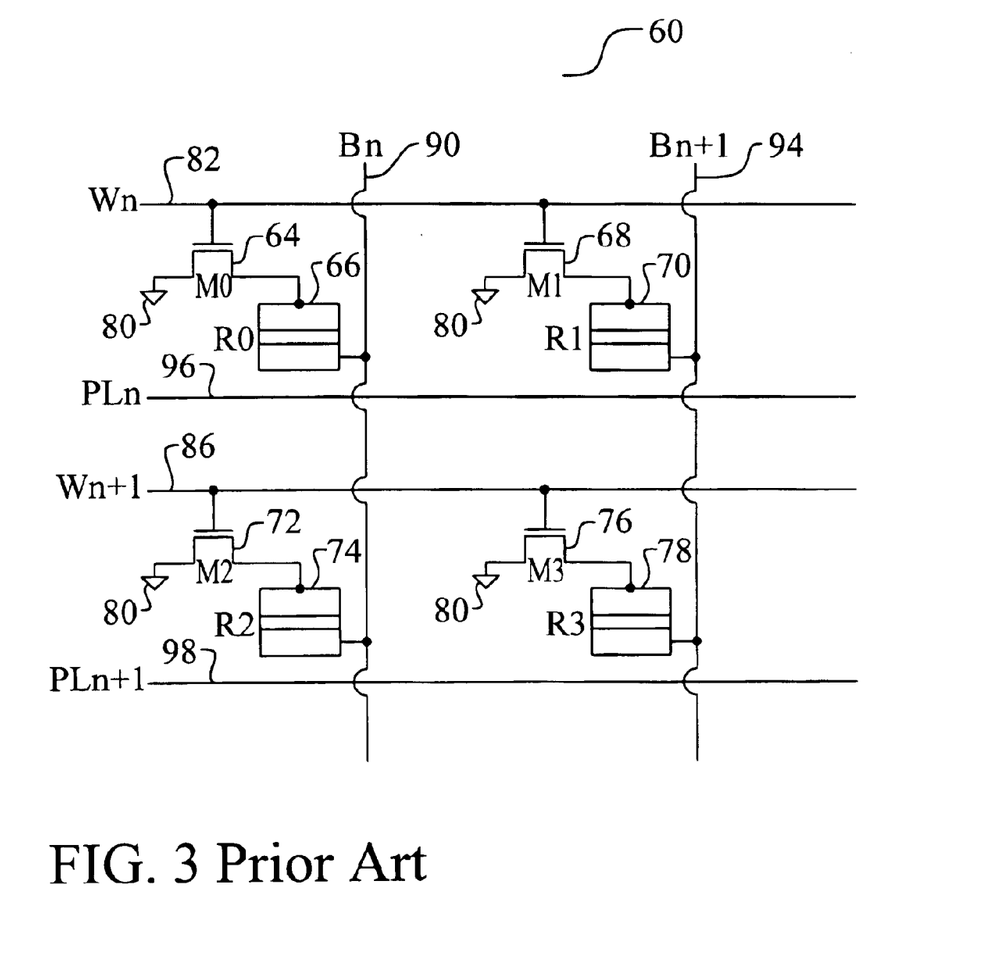
FIG. 3 illustrates a MRAM array of the prior art.

Referring now to FIG. 3, an exemplary MRAM array 60 is illustrated. A 2×2 array of cells is shown. Each cell comprises a MTJ cell and a transistor as shown by R0 66 and M0 64, R1 70 and M1 68, R2 74 and M2 72, R3 78 and M3 76. Each transistor is coupled to a word line signal Wn 82 or Wn+1 86. A cell is written by asserting the word line of that cell, forcing a reading current through the bit line of that cell, and then measuring the voltage on that bit line. For example, to read the state of MTJ cell R1 70, the word line Wn 82 is asserted to turn ON M1 68. The free layer of R1 70 is thereby coupled to ground 80 through M1 68. Next, the reading current is forced on bit line Bn+1 94. Since only reading transistor M1 68 is turned ON, the reading current flows through the R1 cell 70 to ground 80. The voltage of Bn+1 is then measured to determine the state ('0' or '1') of the cell R1 70. Each cell has one reading transistor. Therefore, this type of MRAM architecture is called '1T1R'.

The cells are written using the method described above and illustrated in FIG. 2. Referring again to FIG. 3 and for example, the MTJ cell R2 74 is written by forcing the writing current through the programming line PLn+1 86 and the assist current through the bit line Bn 90. PLn+1 86 and Bn 90 intersect at cell R2 74 such that R2 is programmed. However, note that PLn+1 98 also runs under the non-selected cell R3 78. Therefore, cell R3 is "half-selected." The magnetic field generated by PLn+1 98 can disturb, or flip, the state of R3 78. In addition, Bn 90 also couples to the non-selected cell R0 66. The assist field created by Bn 90 can disturb the state of R0 66. These "half-select" disturbances can cause loss of data or change of switching thresholds.

Figures 4, 5:
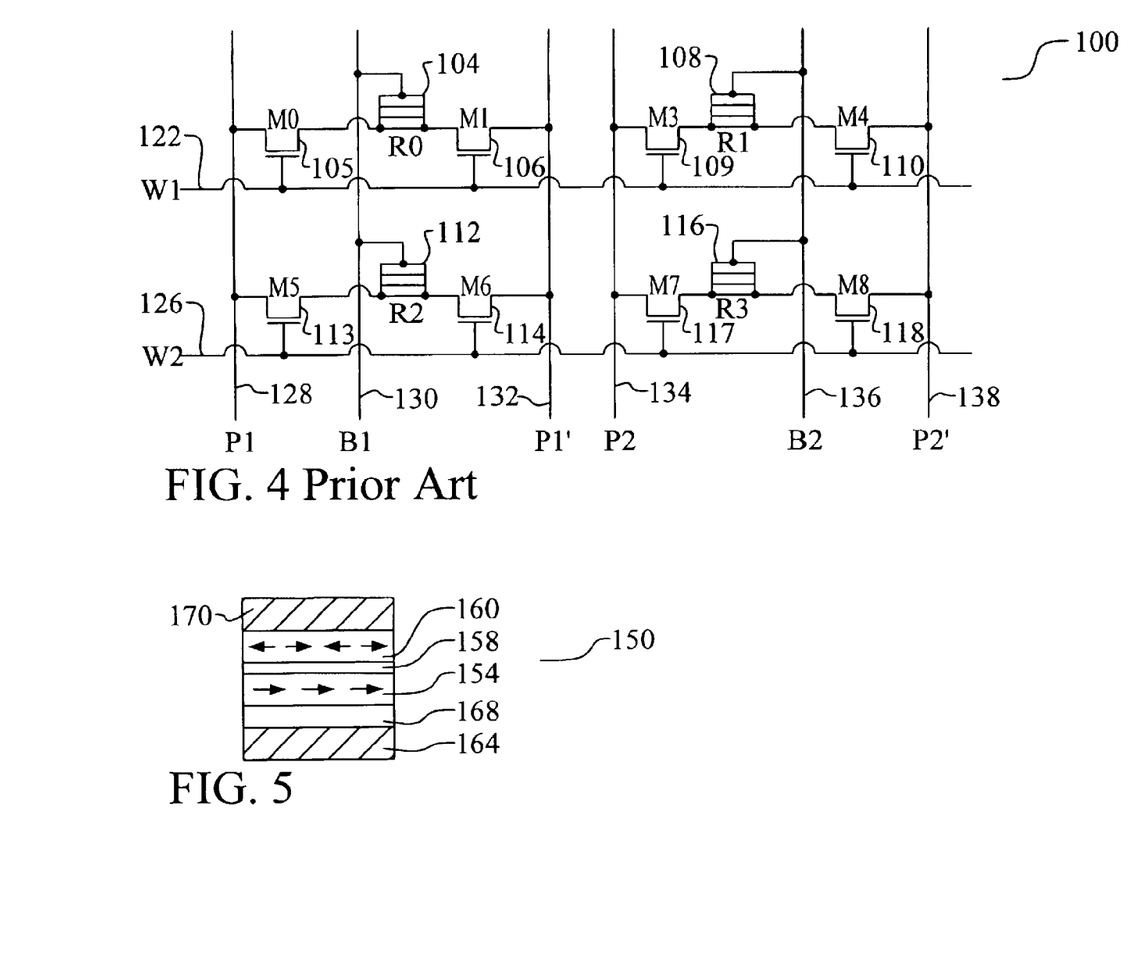
FIG. 4 illustrates an improved MRAM array of the prior art.
FIG. 5 illustrates a preferred embodiment of a magnetic tunnel junction device of the present invention.

Referring now to FIG. 4, a second prior art MRAM array architecture 100 is illustrated. This array 100 uses two transistors for each MTJ cell and is called a 2T1R array. To improve the programming efficiency, the programming current runs through the MTJ cell directly through the pinned layer or through a conductive layer laminated to the pinned layer. By running the programming current in the MTJ instead of in an adjacent conductor, the magnetic coupling is improved such that the programming current can be reduced to about ⅓ the level of the cell illustrated in FIG. 2. Referring again to FIG. 4, the programming current path is changed such that the longitudinal axis of the cell is orthogonal to the writing current path. In this way, the cells can be programmed solely by the magnetic field generated by the programming current without an assist field.

For example, the program cell R1 108, word line W1 is asserted to turn ON transistors M3 109 and M4 110. Next, a writing current is passed through cell R1 108 either from P2 134 to P2' 138 or from P2' 138 to P2 134. The writing current will generated a magnetic field to orient the free layer in R1 108. Note that there are no half-selected cells since the programming current only flows through the selected cell. Each MRAM cell in this array 100 requires two transistors, two programming lines, a bit line, and a word line. While this MRAM architecture is a significant improvement over the previous art shown in FIGS. 1–3, the addition of a transistor to each cell is a significant disadvantage. Further, since both transistors must carry a large programming current, the transistors must be relatively large. In fact, the writing transistors occupy most of the cell area.

Several prior art inventions relate to magnetic RAM devices. U.S. Pat. No. 6,418,046 B1 to Naji teaches an architecture for a MRAM. The MRAM cell is programmed by flowing currents through metal bit lines and digit lines intersecting at the magnetic tunnel junction (MTJ) device. U.S. Pat. No. 6,335,890 B1 to Reohr et al discloses a MRAM architecture where write lines are segmented to reduce cell interference during programming. U.S. Pat. No. 6,272,041 B1 to Naji describes a MTJ MRAM series-parallel architecture. U.S. Pat. No. 6,421,270 B1 to Tai discloses a magneto-resistive RAM.

SUMMARY OF THE INVENTION

A principal object of the present invention is to provide an effective and very manufacturable magnetic RAM integrated circuit device.

A further object of the present invention is to provide a magnetic RAM device comprising a magnetic-tunnel junction (MTJ) device.

A yet further object of the present invention is to provide magnetic RAM cells comprising one transistor, one diode, and one MTJ cell.

A yet further object of the present invention is to provide a magnetic RAM cell with reduced cell size.

A yet further object of the present invention is to provide magnetic RAM cells with low programming current.

A yet further object of the present invention is to provide efficient magnetic RAM array devices.

Another further object of the present invention is to provide unique methods to write and to read a magnetic RAM cell.

Another further object of the present invention to provide a method to form a magnetic RAM array device.

In accordance with the objects of this invention, a magnetic RAM cell device is achieved. The device comprises a MTJ cell comprising a free layer and a pinned layer separated by a dielectric layer. A diode is coupled between the free layer and a reading line. A writing switch is coupled between a first end of the pinned layer and a first writing line. A second end of the pinned layer is coupled to a second writing line.

Also in accordance with the objects of this invention, a magnetic RAM array device is achieved. The device comprises a plurality of first writing lines, a plurality of second writing lines, a plurality of reading lines, a plurality of word lines, and a plurality of magnetic RAM cells. Each magnetic RAM cell comprises a MTJ cell comprising a free layer and a pinned layer separated by a dielectric layer. A diode having an anode coupled to the free layer and a cathode coupled to one of the reading lines. A writing switch is coupled between a first end of the pinned layer and a first writing line. A second end of the pinned layer is coupled to a second writing line. The writing switch is controlled by one of the word lines.

Also in accordance with the objects of this invention, a magnetic RAM array device is achieved. The device comprises a plurality of first writing lines, a plurality of second writing lines, a plurality of reading lines, and a plurality of magnetic RAM cells. Each magnetic RAM cell comprises a MTJ cell comprising a free layer and a pinned layer separated by a dielectric layer. A diode has a cathode coupled to the free layer and an anode coupled to one of the reading lines. A writing switch is coupled between a first end of the pinned layer and a first writing line. A second end of the pinned layer is coupled to a second writing line. The writing switch is controlled by the same reading line as coupled to the anode.

Also in accordance with the objects of this invention, a method of forming a magnetic RAM cell array is achieved. The method comprises providing a plurality of MTJ cells each comprising a free layer and a pinned layer separated by a dielectric layer. A plurality of diodes is formed each comprising cathode and anode terminals. A plurality of writing switches is formed each comprising a MOS transistor having gate, drain, and source terminals. A patterned conductive layer is formed. The patterned conductive layer selectively couples each of the diodes to one of the MTJ cell free layers. The patterned conductive layer selectively couples one of the writing switch sources to a first end of one of the MTJ cell pinned layers.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose magnetic RAM devices. Methods of forming, programming, and reading magnetic RAM devices are disclosed. It should be clear to those experienced in the art that the present invention can be applied and extended without deviating from the scope of the present invention.

Referring now to FIG. 5, a preferred embodiment of the present invention is illustrated. Several important features of the present invention are shown and discussed below. A MTJ cell 150 is illustrated. The MTJ cell 150 comprises a pinned layer 154 and a free layer 160 separated by a dielectric layer 158. The pinned layer 154 and free layer 160 preferably comprise ferromagnetic materials that can be magnetized. The dielectric layer 158 preferably comprises an oxide layer. In addition, the dielectric layer 158 is made relatively thin so that it will conduct current by tunneling when a sufficiently large voltage is applied across the dielectric layer 158.

In addition, the MTJ cell 150 may comprise an anti-ferromagnetic layer 168. The anti-ferromagnetic layer 168 is used to fix the magnetic orientation of the pinned layer 154. A first conductor layer 164, such as a metal, may be added to the pinned side of the cell 150. The first conductor layer 164 reduces the resistance of the pinned side of the cell, especially for programming. It is understood that current flow can occur in any of the layers on the pinned side of the cell. Therefore, the combined pinned layer 154, anti-ferromagnetic layer 168, and first conductor layer 164 are referred to simply as the pinned layer 154 in the remainder of the description. A second conductor layer 170 may be added to the free side of the cell to reduce the resistivity during reading. Again, current flow can occur in either the free layer 160 or the second conductor layer 170. These two layers are simply referred to as the free layer in the remainder of the description.

Figure 6:
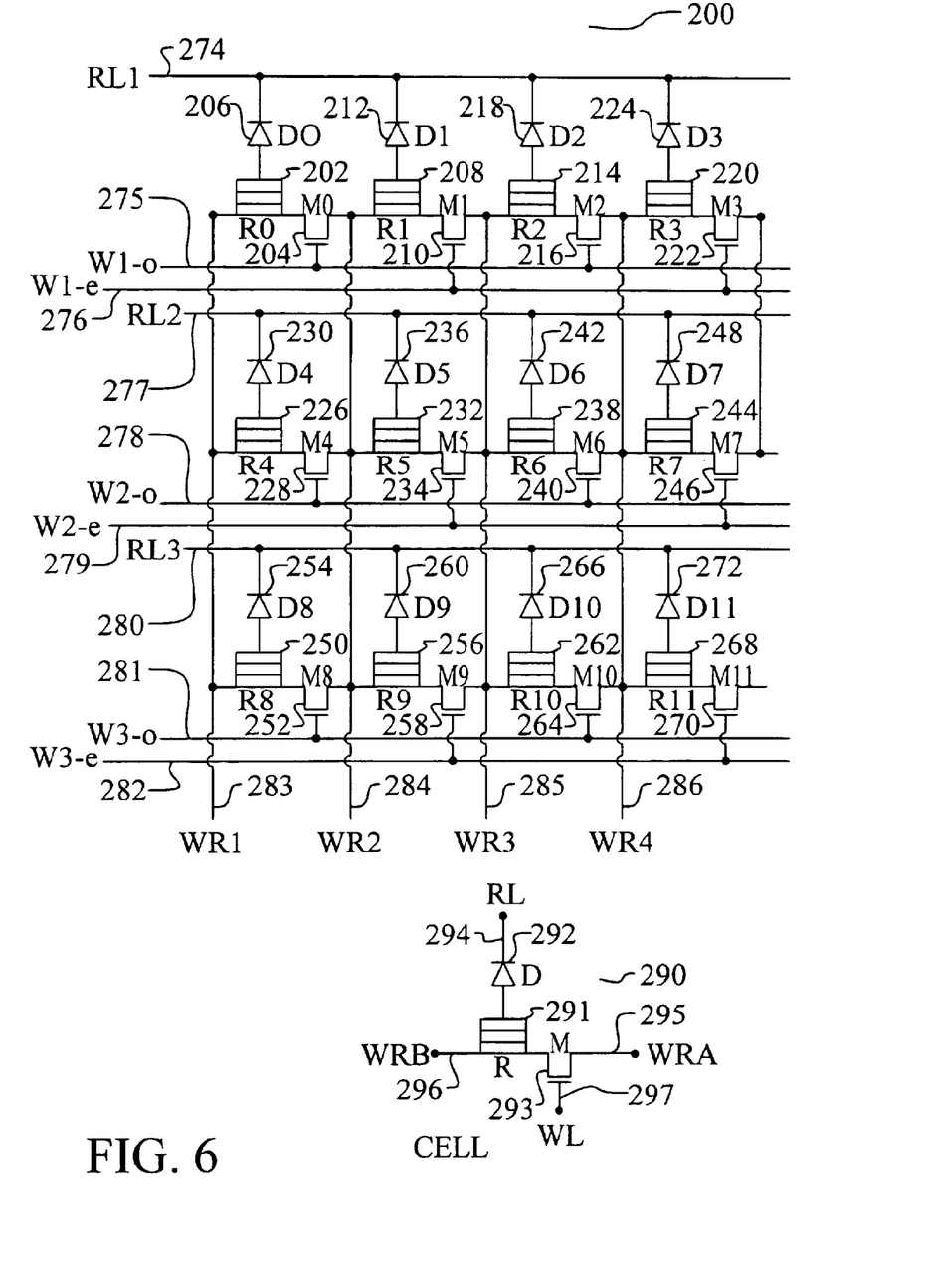
FIG. 6 illustrates a first preferred embodiment of a MRAM array of the present invention.

Referring now to FIG. 6, a first preferred embodiment of a MRAM array 200 of the present invention is illustrated. The array 200 uses a unique MRAM cell 290 as shown. The MRAM cell 290 comprises a MTJ cell 292 comprising a pinned layer, a free layer, with a dielectric layer therebetween. A diode D 292 is coupled between the free layer and a reading line RL 294. Note that the anode of the diode D 493 is coupled to the free layer and the cathode is coupled to the reading line RL 494. A writing switch M 293 is coupled between a first end of the pinned layer and a first writing line WRA 295. A second end of the pinned layer is coupled to a second writing line WRB 296.

The array 200 comprises first, a plurality of first and second writing lines WR1 283, WR2 284, WR3 285, and WR4 286, a plurality of reading lines RL1 274, RL2 277, and RL3 280, a plurality of word lines W1_o 275, W1_e 276, W2_o 278, W2_e 279, W3_o 281, and W3_e 282, and a plurality of magnetic RAM cells having storage elements R0–R11.

This cell arrangement 200 has several unique features. First, the MRAM cell 290 is a 1T1D1R cell. Only the writing switch M 293 carries a large programming current. The diode D 292 carries the relatively small reading current. Using the base cell 290 as an example, the storage element R 291 is written by first asserting the word line WL 297 to turn ON the writing switch M 293. A writing current is then driven through the first writing line WRA 295, the writing switch M 293, the pinned layer of the MTJ R 291, and the second writing line WRB 296. The current may be conducted from the first writing line WRA 295 to the second writing line WRB 296 or from the second writing line WRB 296 to the first writing line WRA 295. The state stored in the cell R 291 depends on the direction of the writing current.

The cell R 291 is read by first grounding the reading line RL 294. Then a reading current is conducted from the second writing line WRB 296 to the reading line 294. The voltage of the second writing line WRB 296 is measured to determine the state of the MTJ cell R 291. The MRAM cell 290 can be made small because only the writing switch M 293 needs to carry the larger writing current. The diode D 292 can be very small.

Preferably, the writing switch M 293 comprises a MOS transistor having gate, drain, and source terminals as is well known in the art. The MOS transistor may comprise NMOS or PMOS. The diode D 292 may comprise a p-n junction formed in a semiconductor substrate, or in a film layer, or by other means well known in the art. The p-n junction may comprise a bipolar transistor, such as an n-p-n or a p-n-p. For example, one of the n-junctions (collector or emitter) of an n-p-n transistor can be shorted to the p-base to form a p-n junction. Alternatively, one of the p-junctions (collector or emitter) of a p-n-p transistor can be shorted to the n-base to form a p-n junction. In addition, a diode may be formed using a MOS transistor where the source terminal is shorted to the gate terminal as is well known in the art.

Note also that the architecture uses two word lines for each row of MRAM cells. This is because the MRAM cells share writing lines. For example, cell R1 208 shares writing line WR2 284 with cell R0 202 and shares writing line WR3 285 with cell R2 214. As a result, the first preferred embodiment requires only N+1 writing lines for an array having N columns. Each row of MRAM cells requires a reading line. For example, the second row uses reading line RL2 277. As a result, N reading lines are required for N rows. At the same time, the architecture requires 2M word lines for M rows. Separate word lines are used for odd and even columns of MRAM cells. For example, in the second row, W2_o 278 is used for the odd columns and W2_e 279 is used for the even columns. This insures that no cells are half-selected as occurred in the prior art. The first preferred embodiment architecture provides a MRAM device with a smaller cell structure by eliminated one large switch for each MRAM cell.

Figure 7:
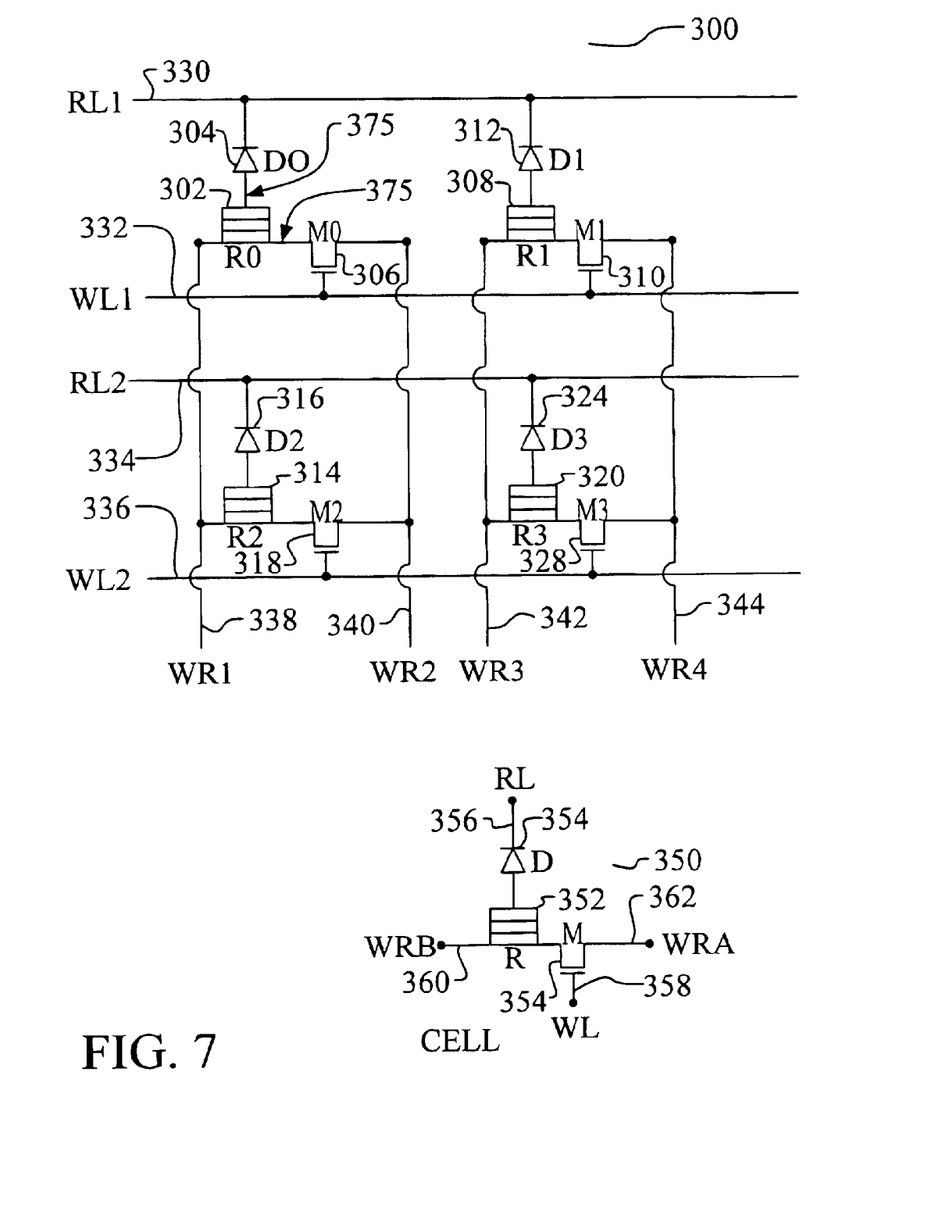
FIG. 7 illustrates a second preferred embodiment of a MRAM array of the present invention.

Referring now to FIG. 7, a second preferred embodiment of the present invention is illustrated. The second preferred embodiment uses the same MRAM cell 350 as used in the first preferred embodiment. This MRAM cell 350 is written and read using the same procedure. However, the array architecture 300 is different. In the second embodiment array 300, the adjacent MRAM cells in a row do not share writing lines. For example, cell R0 302 has first writing line WR2 340 while cell R1 308 has second writing line WR3 342. Because the adjacent MRAM cells in a row do not share writing lines, it is not necessary to use separate word lines for odd and even columns as in the first embodiment. As a result, the second preferred embodiment array 300 requires 2N writing lines for N columns, and M reading lines for M rows, and M word lines for M rows.

Figure 8:
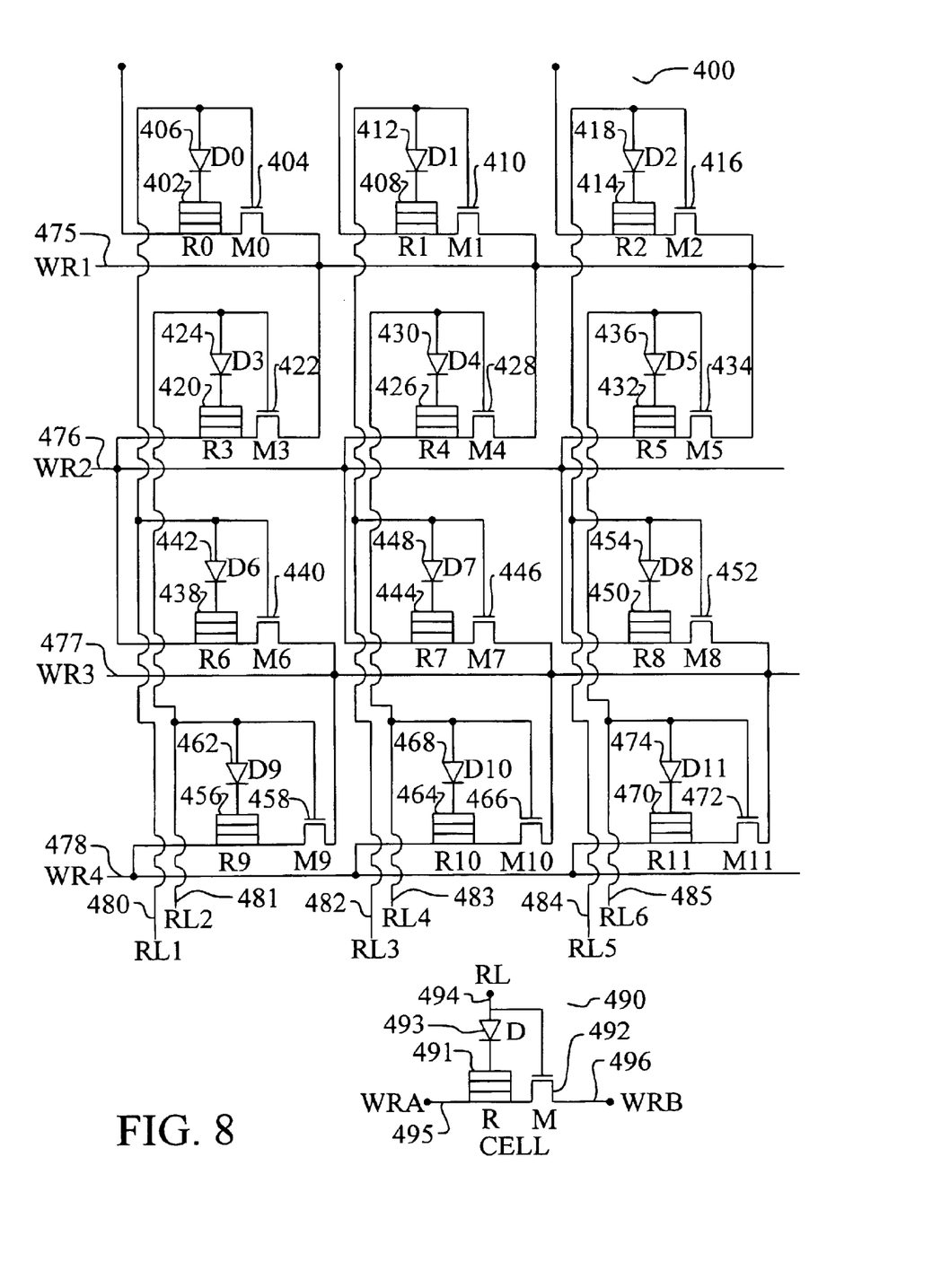
FIG. 8 illustrates a third preferred embodiment of a MRAM array of the present invention.

Referring now to FIG. 8, a third embodiment of the present invention is illustrated. The third embodiment uses a different MRAM cell 490 from the first and second embodiments. The basic cell 490 again uses one switch M 492, one diode D 493, and one MTJ cell R 491. Note two important differences with this MRAM cell 490. First, the diode D 493 is reversed such that the cathode is coupled to the free layer and the anode is coupled to the reading line RL 494. Second, the switch M 492 is coupled to the reading line RL 494 along with the anode. The resulting MRAM cell adds another advantage to the present invention because one terminal is eliminated.

The MRAM cell 490 is read by grounding the first and second writing lines WRA 495 and WRB 496. A reading current is then driven through the reading line RL 494, the diode D 493, the pinned layer and the free layer of the MTJ cell R 491, and through the first and second writing lines WRA 495 and WRB 496. The voltage of the reading line RL 494 is measured to determine the cell state. The MRAM cell 490 is written by asserting the reading line RL 494 to thereby turn ON the writing switch M 492. A writing current is driven through first writing line WRB 496, the writing switch M 492, the pinned layer of R 491, and the second writing line WRA 495 to generate a magnetic field to program the free layer of the MTJ cell R 491.

The third preferred embodiment MRAM array 400 requires less routing lines than the first and second embodiments. Each row uses a single word line. These row lines are labeled as writing lines WR1-WR3 for consistency with the basic cell 490. Each column requires two writing lines RL1–RL6. As a result, the third preferred embodiment requires M+1 lines for M rows and 2N lines for N columns. For example, the second row shares row line WR2 476. Meanwhile, to prevent half-selection, the second column uses reading lines RL3 482 and RL4 483 alternating on even and odd rows.

Figure 9:
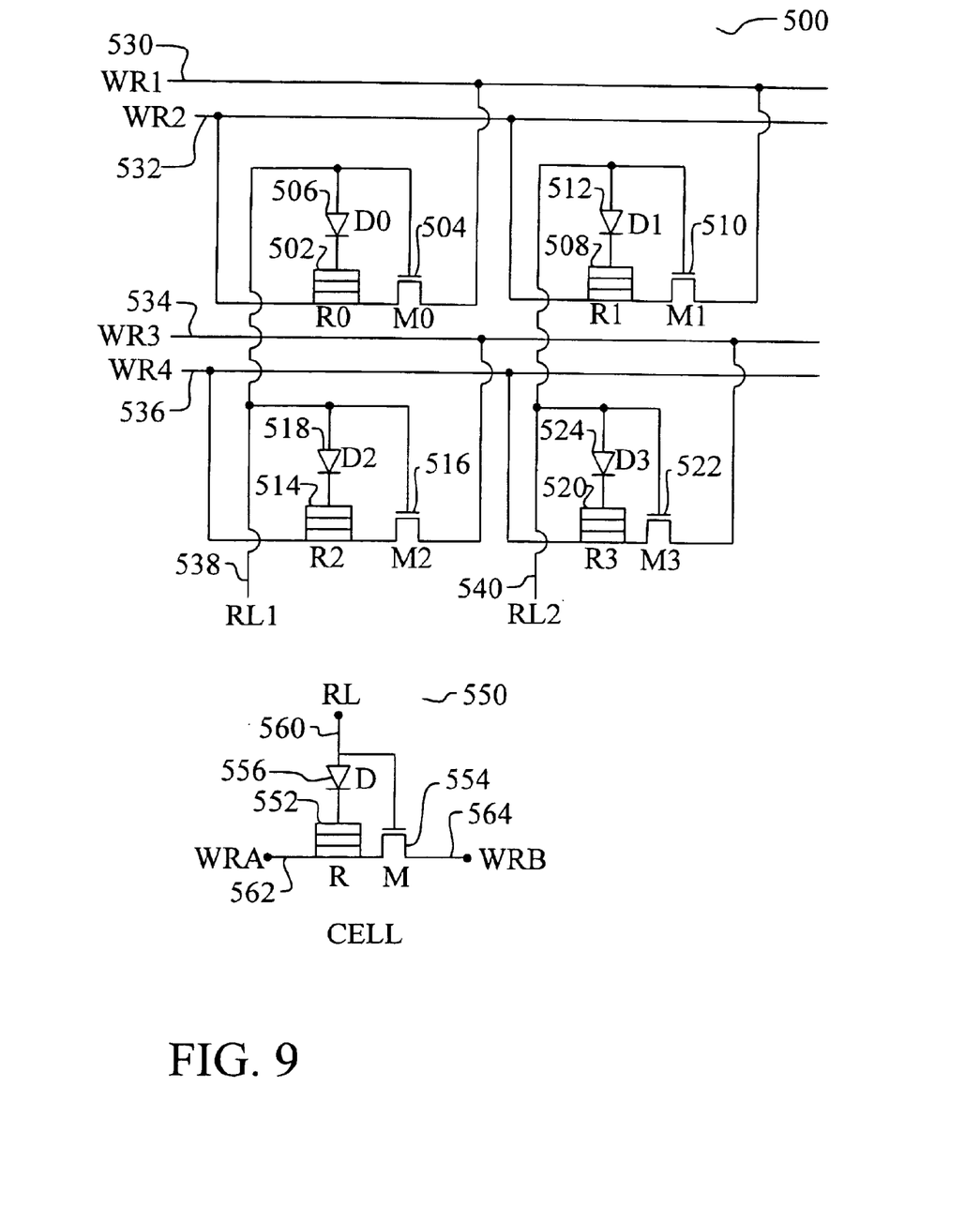
FIG. 9 illustrates a fourth preferred embodiment of a MRAM array of the present invention.

Referring now to FIG. 9, a fourth preferred embodiment MRAM array is illustrated. The fourth preferred embodiment uses the same MRAM cell 550 as used in the third preferred embodiment. This MRAM cell 550 is written and read using the same procedure. However, the array architecture 500 is different. In the fourth embodiment array 500, the adjacent MRAM cells in a row do not share writing lines. For example, cell R0 502 has first writing line WR1 430 while cell R1 508 has second writing line WR2 532. Because the adjacent MRAM cells in a row do not share writing lines, it is not necessary to use separate reading lines for odd and even columns as in the third embodiment. As a result, the fourth preferred embodiment array 500 requires 2N writing lines for N rows, and M reading lines for M columns.

Referring again to FIG. 7, a method for forming an MRAM is also achieved. The method comprises providing a plurality of MTJ cells R0–R3 each comprising a free layer and a pinned layer separated by a dielectric layer. A plurality of writing switches M0–M3 each comprising a MOS transistor having gate, drain, and source terminals is formed. A plurality of diodes D0–D3 each comprising an anode and a cathode is formed. A patterned conductive layer 375 is formed. The patterned conductive layer 375 selectively couples each of the diodes to one of the MTJ cell free layers. The patterned conductive layer 375 selectively couples one of the writing switch sources to a first end of one of the MTJ cell pinned layers.

The advantages of the present invention may now be summarized. An effective and very manufacturable magnetic RAM integrated circuit device is provided. A magnetic RAM device comprising a magnetic-tunnel junction (MTJ) device is achieved. The magnetic RAM cell comprises one transistor, one diode, and one MTJ cell. The magnetic RAM cell has a reduced cell size and low programming current. Several efficient magnetic RAM array devices. Unique methods to write and to read a magnetic RAM cell are achieved. A method to form a magnetic RAM array device is achieved.

As shown in the preferred embodiments, the novel devices and method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A magnetic RAM cell device comprising:
   a MTJ cell comprising a free layer and a pinned layer separated by a dielectric layer;
   a diode coupled between said free layer and a reading line; and
   a writing switch coupled between a first end of said pinned layer and a first writing line wherein a second end of said pinned layer is coupled to a second writing line.

2. The device according to claim 1 wherein said pinned layer comprises a ferromagnetic layer, an anti-ferromagnetic layer, and a conductor layer.

3. The device according to claim 1 wherein said diode comprises a p-n diode.

4. The device according to claim 1 wherein said diode comprises a p-n-p transistor having a p-junction shorted to the base junction or an n-p-n transistor having an n-junction shorted to the base junction.

5. The device according to claim 1 wherein said diode comprises a MOS transistor having gate shorted to source.

6. The device according to claim 1 wherein said magnetic RAM cell device is written by a method comprising:
   turning ON said writing switch; and
   coupling a writing current through said writing switch, said first writing line, said second writing line, and said pinned layer to generate a magnetic field to program said free layer.

7. The device according to claim 1 wherein said writing switch comprises a MOS transistor having drain, source, and gate.

8. The device according to claim 1 wherein an anode of said diode is coupled to said free layer and wherein a cathode of said diode is coupled to said reading line.

9. The device according to claim 8 wherein said magnetic RAM cell device is read by a method comprising:
   grounding said reading line;
   coupling a reading current through said second writing line, said pinned layer, said free layer, and said diode; and
   measuring voltage of said second writing line.

10. The device according to claim 1 wherein a cathode of said diode is coupled to said free layer, wherein an anode of said diode is coupled to said reading line, and wherein said writing switch is controlled by said reading line.

11. The device according to claim 10 wherein said magnetic RAM cell device is read by a method comprising:
    grounding said first and second writing lines;
    coupling a reading current through said first and second writing lines, said pinned layer, said free layer, and said diode; and
    measuring voltage of said reading line.

12. A magnetic RAM array device comprising:
    a plurality of first writing lines;
    a plurality of second writing lines;
    a plurality of reading lines;
    a plurality of word lines; and
    a plurality of magnetic RAM cells wherein each said magnetic RAM cell comprises:
      a MTJ cell comprising a free layer and a pinned layer separated by a dielectric layer;
      a diode having an anode coupled to said free layer and a cathode coupled to one of said reading lines; and
      a writing switch coupled between a first end of said pinned layer and a first writing line wherein a second end of said pinned layer is coupled to a second writing line and wherein writing switch is controlled by one of said word lines.

13. The device according to claim 12 wherein said pinned layer comprises a ferromagnetic layer, an anti-ferromagnetic layer, and a conductor layer.

14. The device according to claim 12 wherein said diode comprises a p-n diode.

15. The device according to claim 12 wherein said diode comprises a p-n-p transistor having a p-junction shorted to the base junction or an n-p-n transistor having an n-junction shorted to the base junction.

16. The device according to claim 12 wherein said diode comprises a MOS transistor having gate shorted to source.

17. The device according to claim 12 wherein one of said magnetic RAM cells in said array device is written by a method comprising:
  asserting said word line of a selected said magnetic RAM cell; and
  coupling a writing current through said writing switch, said first writing line, said second writing line, and said pinned layer of said selected magnetic RAM cell to generate a magnetic field to program said free layer of said selected magnetic RAM.

18. The device according to claim 12 wherein said writing switch comprises a MOS transistor having drain, source, and gate.

19. The device according to claim 12 wherein one of said magnetic RAM cells in said array device is read by a method comprising:
  grounding said reading line of a selected said magnetic RAM cell;
  coupling a reading current through said second writing line, said pinned layer, said free layer, and said diode of said selected magnetic RAM cell; and
  measuring voltage of said second writing line of said selected magnetic RAM cell.

20. The device according to claim 12 wherein adjacent said magnetic RAM cells in a row share a common said word line.

21. The device according to claim 12 wherein said adjacent said magnetic RAM cells in a row share common first and second writing lines.

22. A magnetic RAM array device comprising:
  a plurality of first writing lines;
  a plurality of second writing lines;
  a plurality of reading lines; and
  a plurality of magnetic RAM cells wherein each said magnetic RAM cell comprises:
    a MTJ cell comprising a free layer and a pinned layer separated by a dielectric layer;
    a diode having a cathode coupled to said free layer and an anode coupled to one of said reading lines; and
    a writing switch coupled between a first end of said pinned layer and a first writing line wherein a second end of said pinned layer is coupled to a second writing line and wherein said writing switch is controlled by same said reading line as coupled to said anode.

23. The device according to claim 22 one of said magnetic RAM cells in said array device is read by a method comprising:
  grounding said first and second writing lines of a said selected magnetic RAM cell;
  coupling a reading current through said reading line, said diode, said pinned layer, said free layer, and said first and second writing lines of said selected magnetic RAM cell; and
  measuring voltage of said reading line of said selected magnetic RAM cell.

24. The device according to claim 22 wherein adjacent said magnetic RAM cells in a row share a common said first writing line and share a common said second writing line.

25. The device according to claim 22 wherein said adjacent said magnetic RAM cells in a column share a common said reading line.

26. The device according to claim 22 wherein said pinned layer comprises a ferromagnetic layer, an anti-ferromagnetic layer, and a conductor layer.

27. The device according to claim 22 wherein said diode comprises a p-n diode.

28. The device according to claim 22 wherein said diode comprises a p-n-p transistor having a p-junction shorted to the base junction or an n-p-n transistor having an n-junction shorted to the base junction.

29. The device according to claim 22 wherein said diode comprises a MOS transistor having gate shorted to source.

30. The device according to claim 22 wherein one of said magnetic RAM cells in said array device is written by a method comprising:
  asserting said reading line of a selected said magnetic RAM cell to thereby turn ON said writing switch; and
  coupling a writing current through said writing switch, said first writing line, said second writing line, and said pinned layer of said selected magnetic RAM cell to generate a magnetic field to program said free layer of said selected magnetic RAM.

31. The device according to claim 22 wherein said writing switch comprises a MOS transistor having drain, source, and gate.

32. A method of forming a magnetic RAM cell array comprising:
  providing an plurality of MTJ cells each comprising a free layer and a pinned layer separated by a dielectric layer;
  forming a plurality of diodes each comprising cathode and anode terminals;
  forming a plurality of writing switches each comprising an MOS transistor having gate, drain, and source terminals; and
  forming a patterned conductive layer wherein said patterned conductive layer selectively couples each of said diodes to one of said MTJ cell free layers and wherein said patterned conductive layer selectively couples one of said writing switch sources to a first end of one of said MTJ cell pinned layers.

33. The method according to claim 32 wherein said pinned layer comprises a ferromagnetic layer, an anti-ferromagnetic layer, and a conductor layer.

34. The device according to claim 32 wherein said diode comprises a p-n diode.

35. The device according to claim 32 wherein said diode comprises a p-n-p transistor having a p-junction shorted to the base junction or an n-p-n transistor having an n-junction shorted to the base junction.

36. The device according to claim 32 wherein said diode comprises a MOS transistor having gate shorted to source.

37. The method according to claim 32 wherein said MOS transistors comprise NMOS or PMOS.

38. The method according to claim 37 further comprising forming a plurality of first writing lines, a plurality of second writing lines, a plurality of reading lines, and a plurality of word lines wherein each said doide anode is coupled to said free layer of one of said MTJ cells, wherein each said diode cathode is coupled to one of said reading lines, wherein said each writing switch source is coupled to said pinned layer of one of said MTJ cells, wherein each said writing switch drain is coupled to one of said first writing lines, and wherein each said writing switch gate is coupled to one of said word lines.

39. The method according to claim 37 further comprising forming a plurality of first writing lines, a plurality of second writing lines, and a plurality of reading lines wherein each said diode cathode is coupled to said free layer of one of said MTJ cells, wherein each said diode anode and each said writing switch gate of each said magnetic RAM cell diode is coupled to one of said reading lines, wherein each said writing switch drain is coupled to one said first writing lines, and wherein each said writing switch source is coupled to said pinned layer of one of said MTJ cells.

* * * * *